(12) United States Patent
Ma et al.

(10) Patent No.: US 6,281,109 B1
(45) Date of Patent: *Aug. 28, 2001

(54) ADVANCE METALLIZATION PROCESS

(75) Inventors: Manny Ma; Trung Doan, both of Boise; Jeff Zhiqiang Wu, Meridian, all of ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/571,074

(22) Filed: May 15, 2000

Related U.S. Application Data

(63) Continuation of application No. 08/741,612, filed on Oct. 31, 1996, now Pat. No. 6,066,548.

(51) Int. Cl.$^7$ .................................. H01L 21/4763
(52) U.S. Cl. .................. 438/618; 438/620; 438/622; 438/637
(58) Field of Search .................................. 438/595, 629, 438/576, 618, 620, 622, 637

(56) References Cited

U.S. PATENT DOCUMENTS

| | | | |
|---|---|---|---|
| 4,914,056 | 4/1990 | Okumura | 437/192 |
| 5,229,325 | 7/1993 | Park et al. | 437/187 |
| 5,561,082 | 10/1996 | Matsuo et al. | 437/187 |
| 5,654,237 | 8/1997 | Suguro et al. | 438/624 |
| 5,696,019 | * 12/1997 | Chang | 438/595 |
| 5,719,089 | * 2/1998 | Cherng et al. | 438/637 |
| 5,763,323 | 6/1998 | Kim et al. | 438/637 |
| 5,840,621 | 11/1998 | Kasai | 438/618 |
| 5,854,128 | 12/1998 | Ma et al. | 438/631 |
| 6,071,804 | * 6/2000 | Gau | 438/618 |
| 6,136,696 | * 10/2000 | Horiba | 438/639 |

\* cited by examiner

*Primary Examiner*—T. N. Quach

(57) ABSTRACT

An exemplary implementation of the present invention includes a method for forming conductive lines fabricated in a semiconductor device, the method comprising the steps of forming a first layer of patterned conductive lines, having substantially vertical sidewalls, on a supporting material; of forming insulative spacers about the substantially vertical sidewalls; of forming trenches into the supporting material that align to the insulative spacers; and of forming a second layer of patterned conductive lines such that each line is at least partially embedded within a corresponding trench. Preferably, the conductive lines, formed by a double metal process, are recessed into a supporting material that has a substantially planar surface.

7 Claims, 4 Drawing Sheets

ADVANCE METALLIZATION PROCESS

RELATED APPLICATION

This application is a continuation to U.S. patent application Ser. No. 08/741,612, filed Oct. 31, 1996, now U.S. Pat. No. 6,066,548.

The present application discloses subject matter related to that disclosed in U.S. patent application Ser. No. 08/641,154, filed Apr. 29, 1996, U.S. Pat. No. 5,854,128.

FIELD OF THE INVENTION

This invention relates to a fabrication process for forming conductive lines for semiconductor devices and particularly to a process to form metal lines for semiconductor memory devices.

BACKGROUND OF THE INVENTION

In semiconductor devices, conductive lines are used to interconnect between various devices, between circuitry, or between both. For example, power buses are typically made of a metal that is capable of carrying the required current necessary to operate the device.

In a semiconductor memory device, besides metal power buses, the memory array is interconnected by a grid of column (digit or bit) and row (word) lines. The word lines are typically made of polycrystalline silicon (also know as polysilicon or poly), and topped with a metal silicide, while the bit lines comprise some form of metal.

The bit lines, in a memory array, run basically perpendicular to the word lines and in a parallel fashion to one another. A common characteristic between neighboring bit lines is the capacitive coupling that exists. Digit lines need to be at a specific precharge voltage in order to be read correctly during memory cell sensing. There is a capacitive coupling component between neighboring conductors in many conventional memory array devices, with the result that when a neighboring digit line is pulled high or low, it can couple a digit line above or below the precharge voltage, thus affecting the device's ability to sense data correctly. As memory arrays become denser, the bit lines are crowded even closer together, which in turn will tend to increase the capacitive coupling.

It is desirable to reduce the capacitive coupling between conductive lines and in particular between neighboring bit lines of a memory array in order to provide a more efficient array. The present invention discloses a method to form a conductive line configuration that may be used in any semiconductor device which uses substantially parallel conductors, such as in the memory array of a memory device, or the like, that indeed reduces capacitive coupling between neighboring conductive lines (i.e., neighboring bit lines in a memory array).

SUMMARY OF THE INVENTION

The present invention includes a method for forming conductive lines fabricated in a semiconductor device. In a preferred implementation, the method includes the steps of forming a first layer of patterned conductive lines, which have substantially vertical sidewalls, on a supporting material; of forming insulative spacers about the substantially vertical sidewalls; of forming trenches into the supporting material that align to the insulative spacers; and of forming a second layer of patterned conductive lines such that each line is at least partially embedded within a corresponding trench. Preferably, the conductive lines are formed by a double metal process and the resulting metal lines are recessed into a supporting material that preferably has a substantially planar surface.

DETAILED DESCRIPTION OF THE INVENTION

Figure 7:
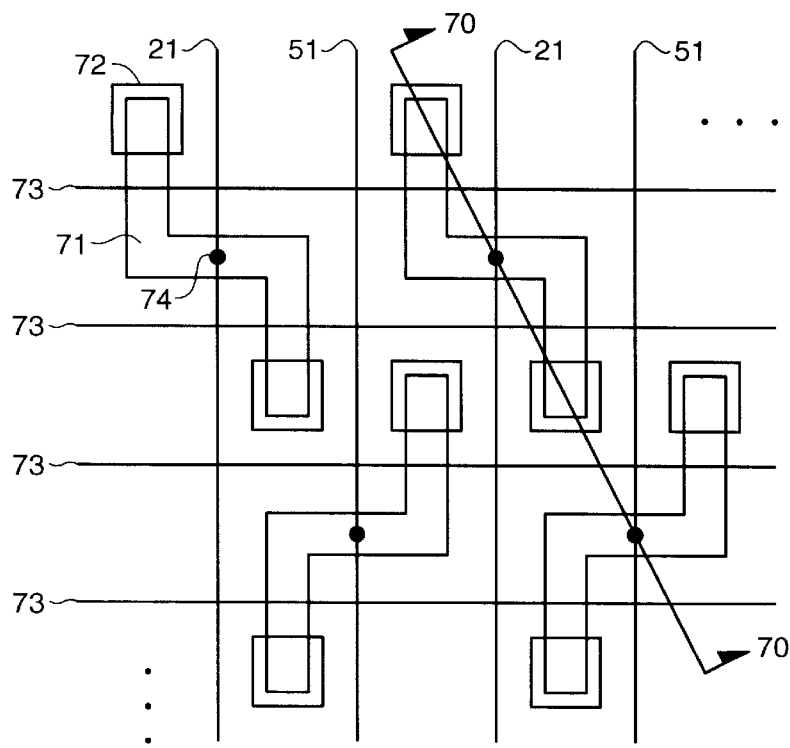
FIG. 7 depicts an array of memory cells which utilizes an aspect of the present invention.
Figure 8:
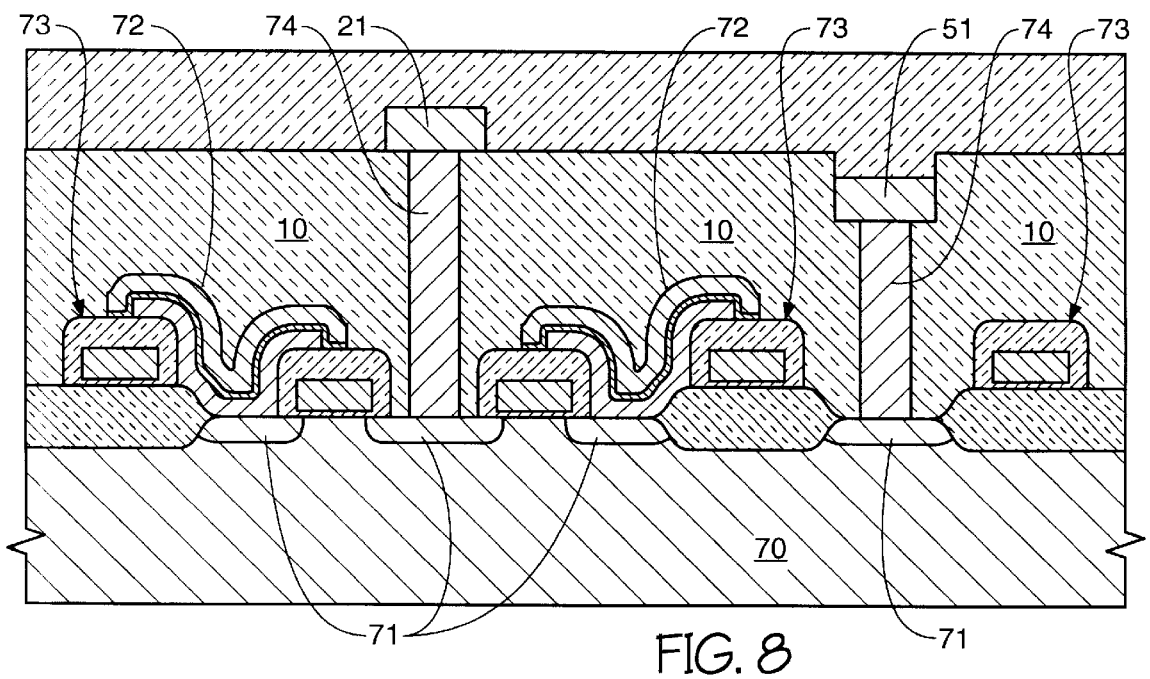
FIG. 8 depicts an approximate representation of a vertical section taken through cross-section 7'—7' of FIG. 7.

Exemplary implementations of the present invention are depicted in the cross-sections of FIGS. 1 through 6. A specific exemplary implementation of the present invention is depicted in FIGS. 7 and 8. These exemplary implementations will be appreciated by one skilled in the art as taught from the following descriptions of the invention.

Figure 1:
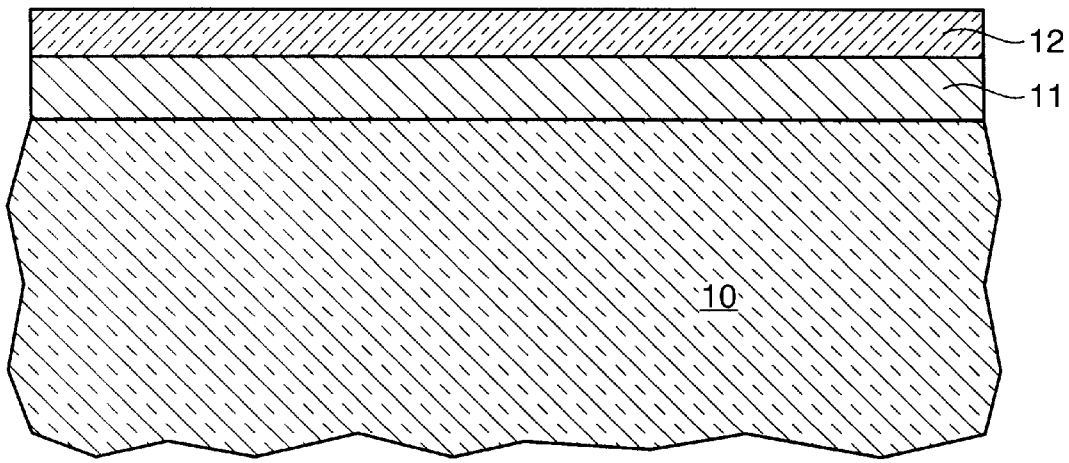
FIG. 1 depicts an in-process wafer assembly having a first metal layer and an oxide layer formed over a substantially planar supporting material, illustrated in vertical section.

Referring now to FIG. 1, an insulating material 10 has been formed and preferably planarized, such as by chemical mechanical polishing. Over insulating material 10, a first metal layer 11 is formed. First metal layer 11 may comprise such metals as aluminum or copper, which are formed by sputtering techniques. On top of first metal layer 11, an insulating layer 12 is formed which will become a hard mask to protect the underlying first metal layer 11 during a second metal etch to be described later in the process. At this point, if insulating material 10 is substantially planar, then ideally, overlying first metal layer 11 and overlying insulating layer 12 will also be substantially planar.

Figure 2:
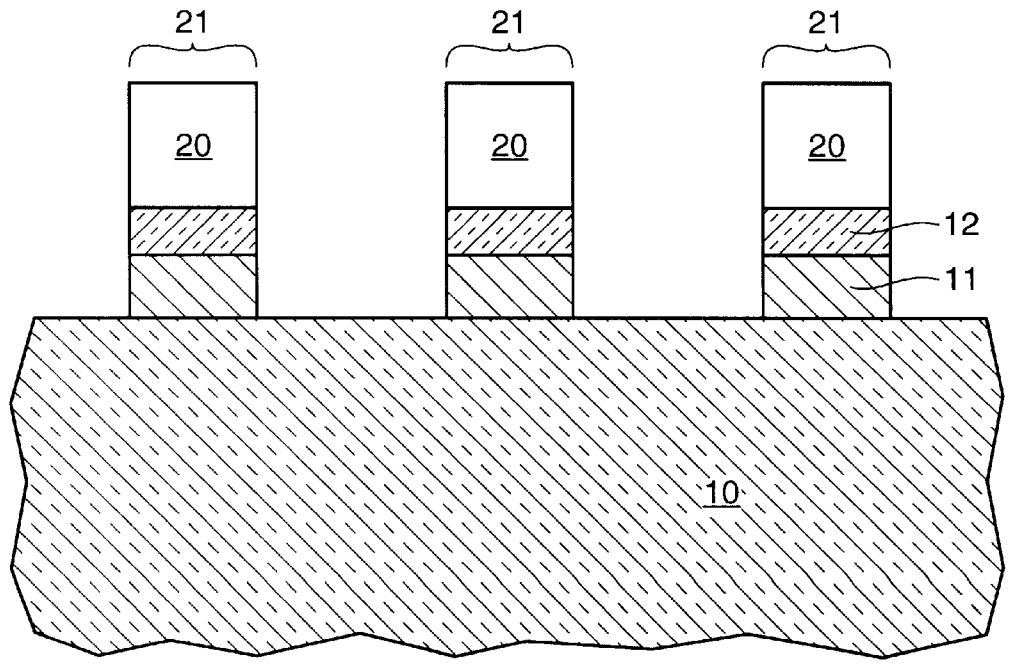
FIG. 2 depicts the in-process wafer assembly of FIG. 1, after the first metal and oxide layers have been patterned and etched.

Referring now to FIG. 2, a photolithography step is performed where a photoresist mask 20 is formed into a desired pattern. As shown, photoresist mask 20 is patterned such that after a subsequent etch of insulating layer 12 and first metal layer 11, adjacent conductive lines 21 are formed, which are isolated from each other.

Figure 3:
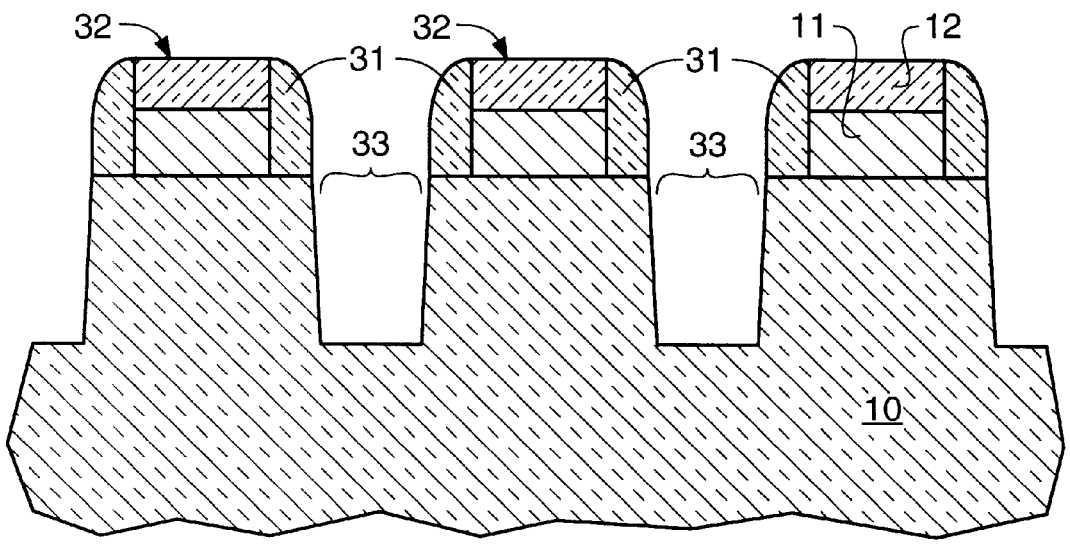
FIG. 3 depicts the in-process wafer assembly of FIG. 2, after a photoresist mask has been stripped, oxide insulation, including oxide spacers, have been formed and trenches are etched into the supporting material using the oxide spacers as a guide.

Referring now to FIG. 3, after photoresist mask 20 is stripped, conductive lines 21 are insulated by the formation of insulating spacers 31 and insulating caps 32, both of which can be formed from a deposited layer of silicon dioxide or silicon nitride. Next, using the insulating spacers as an etching guide, a dry etch is performed to etch trenches 33 into insulating material 10.

Figure 4:
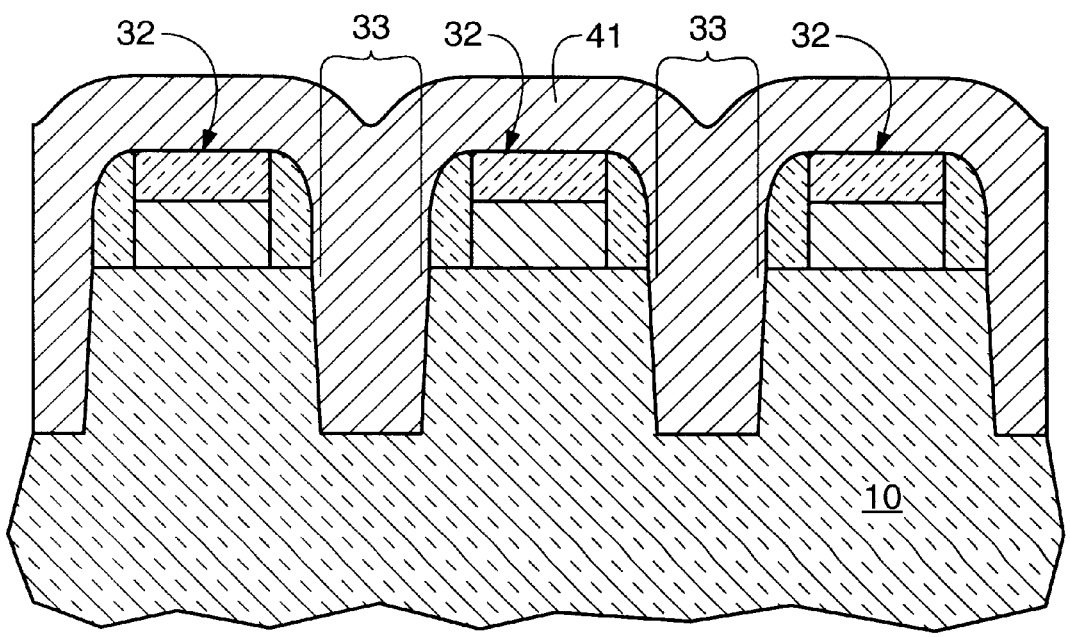
FIG. 4 depicts the in-process wafer assembly of FIG. 3, after a second metal layer has been formed, thereby covering the oxide insulation over the patterned metal structures and also at least partially filling each trench with the second metal layer.

Referring now to FIG. 4, a second metal layer 41 is formed such that layer 41 covers insulated conductive lines 21 and at least partially fills trenches 33. It is preferred that second metal layer 41 effectively fills trenches 33 and thus avoids the formation of keyhole voids in the metal.

Figure 5:
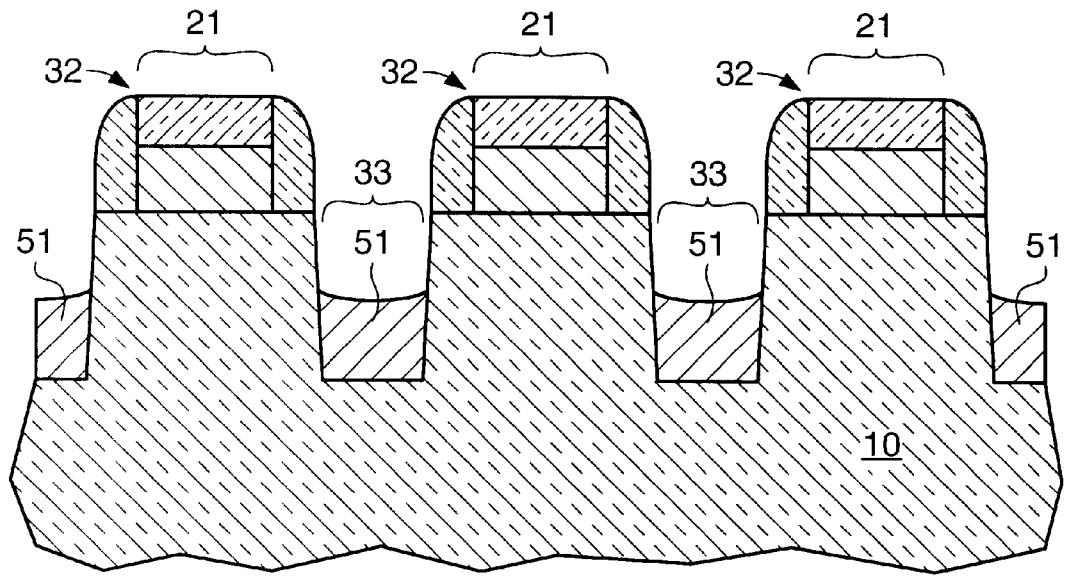
FIG. 5 depicts the in-process wafer assembly of FIG. 4, after the second metal layer has been dry etched, thereby leaving a portion of the second metal layer residing in each trench.

Referring now FIG. 5, a dry etch back of second metal layer 41 is performed for a sufficient duration in order to remove all of the second metal portion overlying insulated conductive lines 21, thereby leaving a second metal layer portion, or conductive lines 51, residing in trenches 33. As shown in FIG. 5, no mask is required during this etch because of the presence of insulating caps 32 and insulating spacers 31, which serve as a hard mask during this etch. It is preferred that conductive lines 51 be at least partially recessed below the surface of insulating supporting material 10 as capacitive coupling between a conductive line 21 and an adjacent conductive line 51 is substantially reduced. A preferred aspect ratio (width:depth) of the trench would range from 1:2 to 1:4. For example, if the trench is 0.25 microns wide, the depth of the trench could range from 0.5 microns to 1 micron. The trench depth would further enhance the reduction of capacitive coupling between lines 21 and 51 as a deeper trench would allow increased separation between lines 21 and 51.

The resulting configuration of conductive lines 21 and conductive lines 51, forms a plurality of substantially parallel conductive lines. Implementing this configuration into the physical layout of a semiconductor device that uses a plurality of conductive lines will prove beneficial as less surface area of a given dice would be required, as well as the reduction of inter-metal capacitance.

Figure 6:
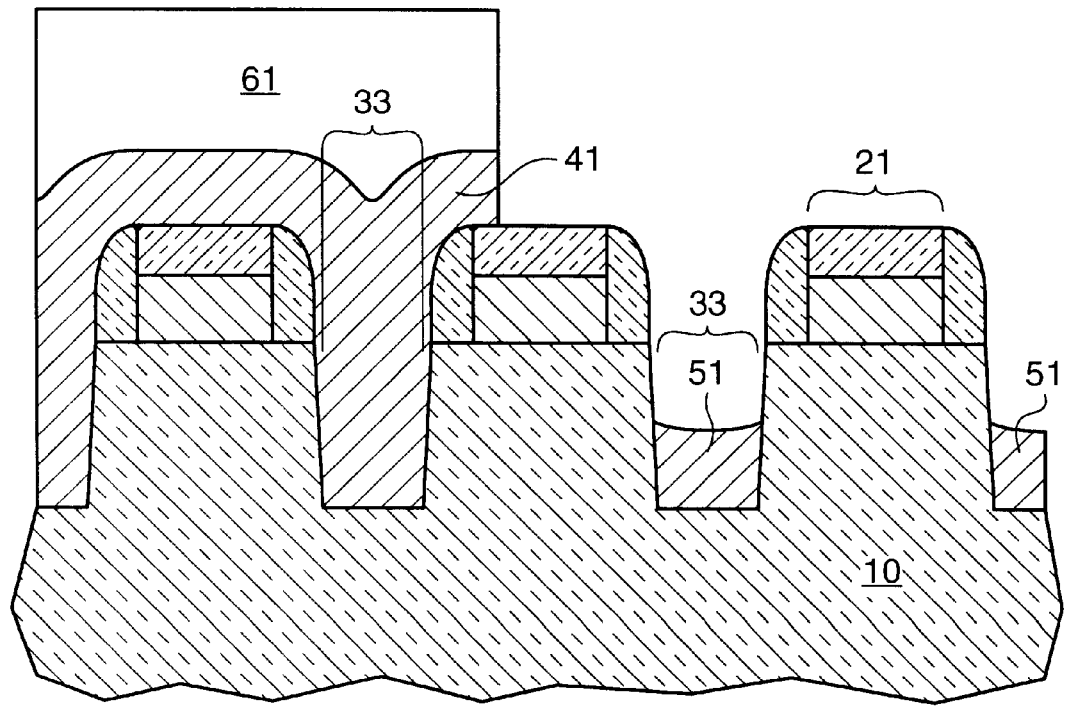
FIG. 6 depicts the in-process wafer assembly of FIG. 4, after an alternate step of using a mask over the second metal layer to allow a subsequent etch to leave selected trench residing metal strapped together.

Alternately and referring now to FIG. 6, rather than performing the dry etch of second metal layer 41 without the presence of a mask, a photoresist mask 61 is patterned so that at least two adjacent conductive lines 51 are strapped together after a subsequent etch is performed. This configuration could prove beneficial when used to construct interconnecting conductive lines in a semiconductor, such as the interconnections of a power bus, or for interconnections in a semiconductor device that uses a double-metal process.

In either of the above embodiments, the width and depth of the trenches would depend on such factors as, the specific application for a given semiconductor device. For example, the width of the trench opening must be great enough so that a given process for sputtering metal will satisfactorily fill the trench without forming a keyhole void. Likewise, the depth of the trench would also depend on the desired application. If a connection to a conductive material that underlies the insulating material is desired, then the dry etch of the trench could continue through the insulating material until the underlying conductive material is exposed. If conductive lines 51 are to remain isolated, then the dry etch would continue only long enough to form the desired trench depth and yet provide sufficient isolation underneath conductive lines 51, by the remaining thickness of the underlying insulating material.

Alternately, in any one of the embodiments presented, one or more of the conductive lines may comprise a conductively doped polysilicon and the polysilicon may be further coated with a silicide material, if polysilicon will serve as a sufficient conductor for which the conductor is intended. If polysilicon is used to form the conductive lines it is preferred that the silicide material be formed by a salicide process.

A specific exemplary implementation of the present invention is depicted in FIGS. 7 and 8. The configuration of a plurality of conductive lines of the present invention, as described in FIGS. 1–5, is implemented in a memory device (such as random access memories, both static and dynamic) fabrication process. The configuration shown in FIG. 7 demonstrates a plurality of conductive lines that serve as digit lines used to access individual storage cells in a memory array.

Referring now to FIG. 7, a simplified top view of an array of memory cells is depicted. A plurality of active areas 71 is placed in a column/row arrangement so that each active area is intersected by at least one word line 73. The intersection of word lines 73 over active areas 71 define access transistors, thus providing access to an associated capacitor 72. Providing a path for data transmission to and from capacitors 72 are associated bits lines 51 or 21. Bit lines 51 and 21 represent the conductive lines formed by the method of the present invention as described in the method depicted in FIGS. 1–5.

FIG. 8 shows a representative cross-sectional view of FIG. 7 taken through cross-sectional lines 7'—7'. Referring to FIG. 8, active areas 71 are formed into silicon substrate 70. Word lines 73 intersect active areas 71 to form access devices to associated storage capacitors 72. Insulation layer 10 covers the access devices and storage capacitors and conductive plugs 74 make contact to the desired active areas 71. Then, in accordance with the presence invention, conductive lines 21 and 51 (serving as bits lines in this specific case) are formed. After the formation of conductive lines 21 and 51, the entire semiconductor assembly is covered with insulation layer 80.

Though this specific implementation of the present invention describes the formation of a dynamic memory array using access transistors and storage capacitors, one skilled in the art will appreciate that a static memory cell may also use the method of forming conductive lines in accordance with the present invention to form a memory array of static storage cells.

It is to be understood that although the present invention has been described with reference to preferred embodiments, various modifications, known to those skilled in the art, may be made without departing from the invention as recited in the several claims appended hereto.

What is claimed is:

1. A double metal process for forming conductive lines fabricated in a semiconductor device, said process comprising the steps of:

forming a first metal layer on a material having a substantially planar surface;

forming a hard mask layer over said first metal layer;

patterning and etching said hard mask layer and said first metal layer to form a patterned hard mask overlying a first plurality of patterned metal lines;

forming insulative spacers about said patterned hard mask and said patterned metal lines;

forming trenches into said material along side said insulative spacers;

forming a second metal layer that covers said patterned hard mask, said insulative spacers and at least partially fills said trenches;

removing a portion of said second metal layer covering said hard mask to form a second plurality of patterned metal lines wherein each metal line of said second plurality of patterned metal lines is completely recessed within a corresponding trench;

wherein said step of forming a first metal layer and said step of forming a second metal layer are separate metal deposition steps and wherein the upper surfaces of said first plurality of patterned metal lines is above the upper surfaces of said second plurality of patterned metal lines.

2. The method of claim 1, wherein said second plurality of patterned metal lines are recessed below said substantially planar surface of said material.

3. The method of claim 1, wherein said step of removing a portion of said second metal layer comprises at least one removal method of chemical mechanical polishing and dry etching.

4. The method of claim 3, wherein said step of removing a portion of said second metal layer is performed without the use of a mask.

5. The method of claim 1, further comprising the step of:
forming a second patterned hard mask over said second metal layer at selected locations prior to said step of removing said portion of said second metal layer and thereafter leaving at least two adjacent metal lines strapped together.

6. A method for forming a dynamic memory array fabricated in a semiconductor device, said process comprising the steps of:
forming a semiconductor substrate assembly having a plurality of dynamic memory cells;
forming an insulative material having a substantially planar surface over said semiconductor substrate assembly;
forming a first metal layer on said insulative material;
forming a hard mask layer over said first metal layer;
patterning and etching said hard mask layer and said first metal layer to form a patterned hard mask overlying a first plurality of patterned metal lines;
forming insulative spacers about said patterned hard mask and said patterned metal lines;
forming trenches into said insulative material along side said insulative spacers;
forming a second metal layer that covers said patterned hard mask, said insulative spacers and at least partially fills said trenches;
removing a portion of said second metal layer covering said hard mask to form a second plurality of patterned metal lines wherein each metal line of said second plurality of patterned metal lines is completely recessed within a corresponding trench;
wherein said step of forming a first metal layer and said step of forming a second metal layer are separate metal deposition steps and wherein the upper surfaces of said first plurality of patterned metal lines is above the upper surfaces of said second plurality of patterned metal lines.

7. A method for forming a static memory array fabricated in a semiconductor device, said process comprising the steps of:
forming a semiconductor substrate assembly having a plurality of static memory cells;
forming an insulative material having a substantially planar surface over said semiconductor substrate assembly;
forming a first metal layer on said insulative material;
forming a hard mask layer over said first metal layer;
patterning and etching said hard mask layer and said first metal layer to form a patterned hard mask overlying a first plurality of patterned metal lines, said etching resulting in sidewalls along edges of said;
forming insulative spacers about said patterned hard mask and said patterned metal lines;
forming trenches into said insulative material along side said insulative spacers;
forming a second layer that covers said patterned hard mask, said insulative spacers and at least partially fills said trenches;
removing a portion of said second layer covering said hard mask to form a second plurality of patterned metal lines wherein each metal line of said second plurality of patterned metal lines is completely recessed within a corresponding trench;
wherein said step of forming a first metal layer and said step of forming a second metal layer are separate metal deposition steps and wherein the upper surfaces of said first plurality of patterned metal lines is above the upper surfaces of said second plurality of patterned metal lines.

* * * * *